United States Patent [19]
Koyanagi

[11] Patent Number: 5,453,913
[45] Date of Patent: Sep. 26, 1995

[54] TAB TAPE

[75] Inventor: Tatsunori Koyanagi, Sagamihara, Japan

[73] Assignee: Minnesota Mining and Manufacturing Company, St. Paul, Minn.

[21] Appl. No.: 233,334

[22] Filed: Apr. 26, 1994

[30] Foreign Application Priority Data

May 28, 1993 [JP] Japan ................................ 5-127023

[51] Int. Cl.⁶ .................................................. H05K 1/18
[52] U.S. Cl. .............................. 361/813; 29/827; 174/262
[58] Field of Search ............................. 174/52.5, 52.4, 174/262, 266; 361/728, 813; 29/827

[56] References Cited

U.S. PATENT DOCUMENTS

| | | | |
|---|---|---|---|
| 4,234,666 | 11/1980 | Gursky | 428/573 |
| 4,330,790 | 5/1982 | Burns | 357/70 |
| 5,064,706 | 11/1991 | Ueda et al. | 428/131 |
| 5,235,415 | 10/1993 | Dennis | 29/827 |
| 5,270,197 | 12/1993 | Kondo et al. | 174/267 |
| 5,284,725 | 2/1994 | Takatsu | 430/5 |
| 5,288,539 | 2/1994 | Araki . | |

*Primary Examiner*—Leo P. Picard
*Assistant Examiner*—L. Thomas
*Attorney, Agent, or Firm*—Gary L. Griswold; Walter N. Kirn; Darla P. Neaveill

[57] ABSTRACT

A TAB tape having multiple metallic conductors arranged on the surface of a base film with substantially square device holes is formed with designed areas of stress relief formed by one or more slits and/or arrays of holes which extend outward from the corners or sides of the device holes, such that dimensional stability in the base film is improved in a direction parallel to inner leads when thermo-compression bonding is performed to connect the inner leads with IC chips resulting in improved connection reliability for connection between inner leads and IC chips.

1 Claim, 2 Drawing Sheets

TAB TAPE

BACKGROUND OF THE INVENTION

1. Field of the Invention

The present invention relates to am improved TAB (Tape Automated Bonding) tape offering excellent dimensional stability and superb reliability for connection with IC chips.

2. Prior Art

In recent years, TAB tape having multiple metallic conductors arranged on the surface of a base film, has been widely adopted because it enables high-density integration of circuits in a chip and improves the freedom in integration.

However, in conventional TAB tapes, the thermal expansion or contraction of a base film occurring when thermocompression bonding is performed to connect IC chips with inner leads causes a dimensional change or deteriorates connection reliability. The present invention provides designed areas of stress relief in the base film.

The present invention provides a TAB tape capable of absorbing or alleviating the thermal expansion or contraction of a base film occurring when thermocompression bonding is performed to connect inner lead tips with IC electrodes, or in particular, a TAB tape permitting the arrangement of inner leads at a very small pitch with intervals of 0.4 mm or less.

The present invention provides a TAB tape having multiple metallic conductors arranged on the surface of a base film with substantially square device holes. In the TAB tape, one or more slits are formed to provide areas of stress relief which extend outward from the corners or sides of the device holes or along the sides of the device holes.

In the present invention, an array of holes may be formed instead of or together with the foregoing slits to provide the stress relief. It is preferred that both the holes and array of slits are formed to ensure the dimensional stability and connection reliability of a TAB tape without impairing the mechanical strength of a base film.

Another embodiment of the present invention employs a base film having small holes all over the surface thereof.

According to the present invention, before metallic conductors are arranged on a base film, holes can be bored appropriately and easily. Moreover, even when the number of slits or array of holes are limited, a TAB tape according to the present invention offers excellent dimensional stability and connection reliability.

The shape of each array of holes or small holes in a base film is not limited to any specific one. However, a circle is preferred for easy etching or punching of the base film. Preferably, each of the holes has a longitudinally shape of a funnel opening into the opposite side of a surface on which metallic conductors are arranged, which contributes to further improvement in the dimensional stability of a base film.

Furthermore, a TAB tape according to the present invention may have either a so-called three-ply structure in which an adhesive layer is interposed between metallic conductors and a base film or a two-ply structure not including the adhesive layer. The two-ply structure is preferred, because slits and an array of holes can be formed easily by performing etching that involves a base film.

In a TAB tape of the present invention, multiple metallic conductors are arranged on the surface of a base film having generally square device holes, and one or more designed areas of stress relief are formed to extend outward from the corners or side of the device holes or along the sides of the device holes. When thermocompression bonding is performed to connect inner leads with IC chips, the slits or holes absorb or alleviate the thermal expansion or contraction of the base film in a direction parallel to the inner leads. This results in the improved connection reliability for connection between the inner leads and IC chip.

BRIEF DESCRIPTION OF THE DRAWING

FIG. 7 shows an enlarged cross section of a TAB tape having a three-ply structure, in which an adhesive layer is included, according to the present invention. Next, the present invention will be described more particularly in conjunction with the drawing; wherein

DETAILED DESCRIPTION OF THE PRESENTLY PREFERRED EMBODIMENTS

Figure 1:
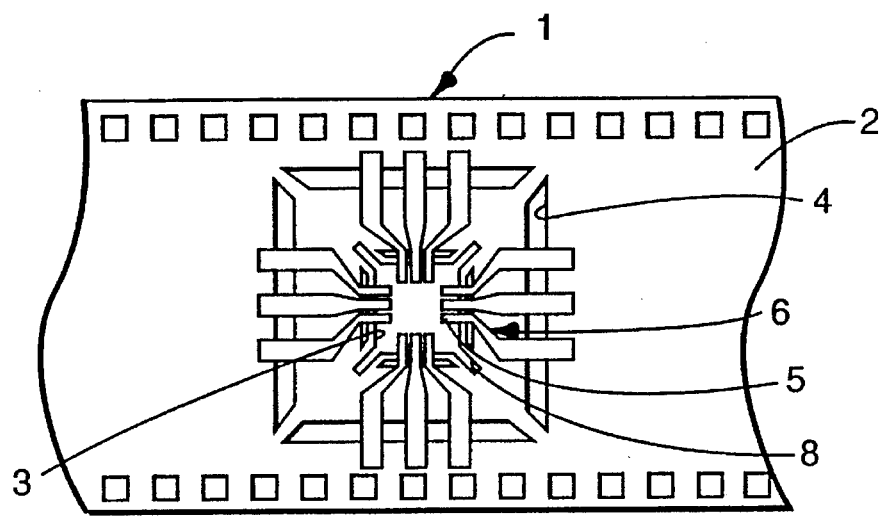
FIG. 1 is a schematic plan view of a TAB tape according to the present invention.
Figure 2:
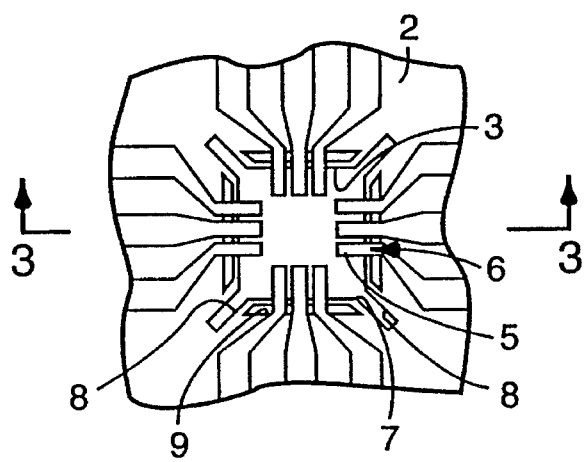
FIG. 2 is an enlarged view of a main section of the TAB tape of the present invention shown in FIG. 1.
Figure 3:
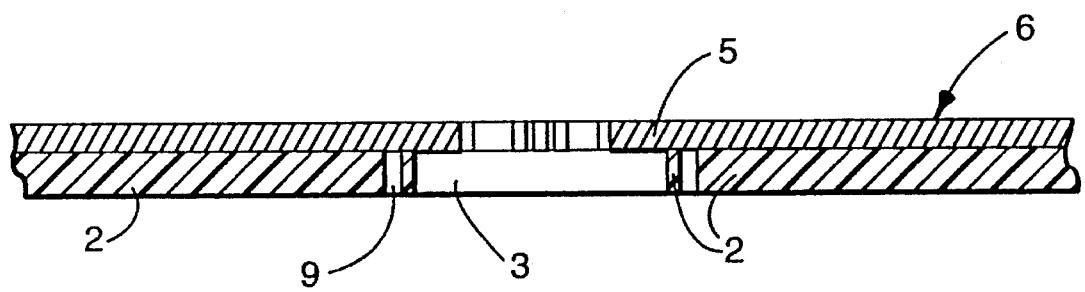
FIG. 3 shows an enlarged cross section taken along line 3—3' of FIG. 2.

In FIG. 1, numerous device holes 3 are formed in the longitudinal direction of a base film 2 forming a TAB tape 1. Slits 4 surround the device holes 3 to assist in separating devices from the tape. In FIGS. 1 to 3, inner leads 6 are arranged on the surface of the base film so that the tips 5 thereof will stretch over the device holes 3.

In contrast with the foregoing structure of a prior art, the present invention provides a structure having designed areas of stress relief which are in the form of slits 8 extending radially from corners 7, preferably from four corners of each of the device holes 3. The slits 8 communicate with the device holes 3 at one of the ends thereof. The width of each slit ranges from 30 to 180 micrometers, or preferably, from 50 to 80 micrometers. The length thereof ranges from 0.3 to 3 mm, or preferably, from 1 to 2 mm. The slits 8 absorb or alleviate the thermal expansion or contraction of the base film 2 in a direction perpendicular to the inner leads.

Moreover, slits 9 are formed close to and along four sides of each of the device holes 3. The slits 9 are independent of the slits 8 and do not communicate therewith. The width of each of the slits 9 ranges from 30 to 180 micrometers, or preferably, from 50 to 80 micrometers. The distance thereof from the edge of the base film facing the associated one of the device holes 3 ranges from 100 to 400 micrometers, or preferably, from 150 to 250 micrometers. The slits 9 absorb or alleviate the thermal expansion or contraction of the base film 3 in a direction parallel to the inner leads.

Figure 4:
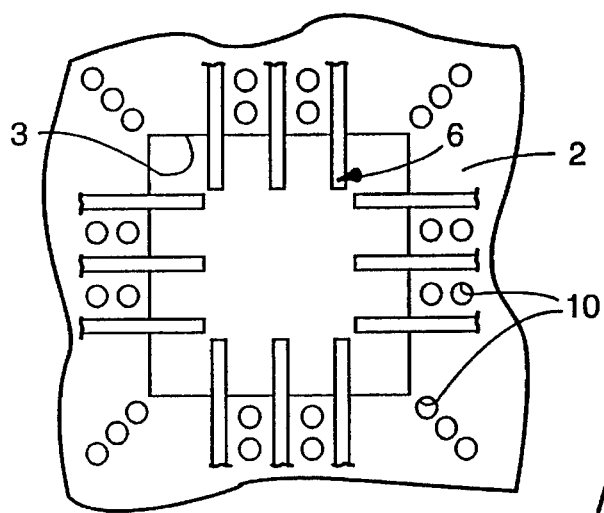
FIG. 4 Is a plan view of a main section of a TAB tape according to the present invention.

FIG. 4 shows a TAB tape that has multiple tandem holes 10 defining the slits or areas of stress relief.

The diameter of each hole is determined depending on the pitch at which leads are arranged on a TAB tape employed and the reliability of integrated circuits. Specifically, a diameter ranging from 10 to 180 micrometers is preferred. A diameter of less than 10 micrometers permits little improvement in connection reliability. A diameter exceeding 180 micrometers is inapplicable for the micro-pitch of 400 micrometers or less.

Figure 5:
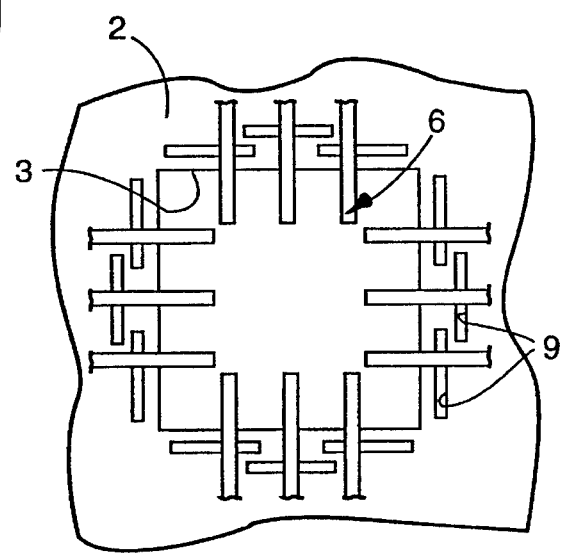
FIG. 5 is a plan view of a main section of a TAB tape according to the present invention.
Figure 6:
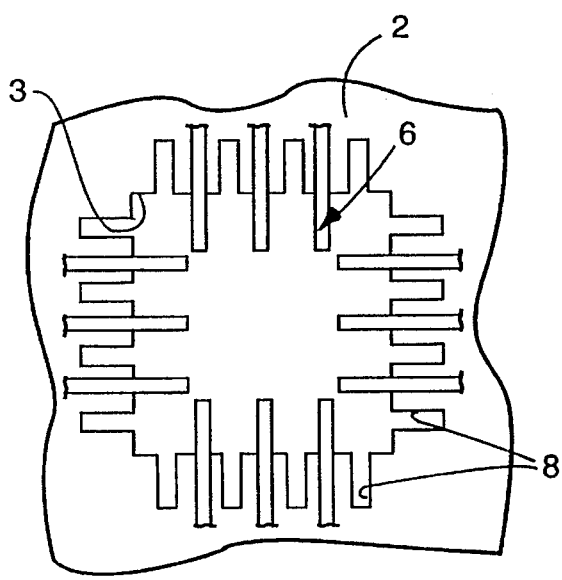
FIG. 6 is a plan view of a main section of a Tab tape according to the present invention.

FIG. 5 and 6 show other embodiments. In FIG. 5, multiple slits 9 are formed along the sides of a device hole 3. In FIG. 6, slits 8 are formed perpendicularly to the sides of a device hole 3.

Figure 7:
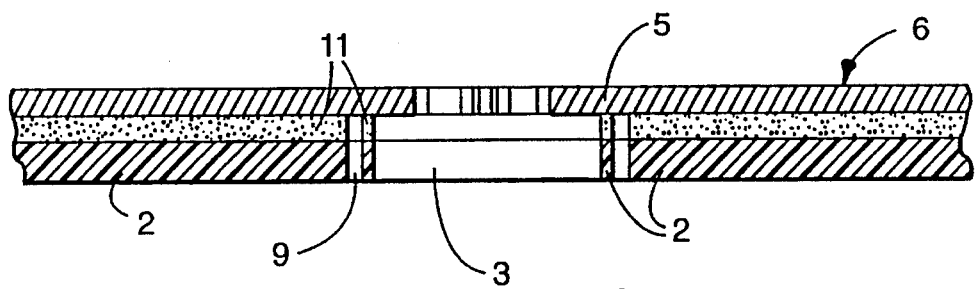

FIG. 7 shows a structure of FIG. 3 in which an inner lead 6 is attached to a base film 2 with an adhesive layer 11.

I claim:

1. A tape automated bonding tape having a plurality of metallic conductors arranged on one surface of a base film having generally square device holes each device hole having a plurality of sides and corners connecting said sides, and means defining areas of stress relief formed to extend about the sides of said device holes for improving dimensional stability, said means defining areas including slits extending parallel to said sides of said device holes and slits extending outward from said corners of said device holes, wherein said tape has a two-ply structure in which an adhesive layer is interposed between said metallic conductors and a base film.

* * * * *